(12) United States Patent
Iguchi et al.

(10) Patent No.: US 11,863,144 B2
(45) Date of Patent: Jan. 2, 2024

(54) OSCILLATION CIRCUIT WITH IMPROVED FAILURE DETECTION

(71) Applicant: QUALCOMM Incorporated, San Diego, CA (US)

(72) Inventors: Shunta Iguchi, San Diego, CA (US); Nikunj Mehta, San Diego, CA (US); Michael Naone Farias, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/652,716

(22) Filed: Feb. 28, 2022

(65) Prior Publication Data

US 2023/0275551 A1    Aug. 31, 2023

(51) Int. Cl.
| | |
|---|---|
| *H03G 3/30* | (2006.01) |
| *H04B 1/10* | (2006.01) |
| *H04B 1/16* | (2006.01) |
| *H04B 17/318* | (2015.01) |
| *H04B 1/26* | (2006.01) |

(52) U.S. Cl.
CPC .............. *H03G 3/3036* (2013.01); *H04B 1/10* (2013.01); *H04B 1/1607* (2013.01); *H04B 1/26* (2013.01); *H04B 17/318* (2015.01)

(58) Field of Classification Search
CPC ...... H03G 3/3036; H04B 1/10; H04B 1/1607; H04B 1/26; H04B 17/318
See application file for complete search history.

(56) References Cited

U.S. PATENT DOCUMENTS

| | | | |
|---|---|---|---|
| 7,863,989 B2 | 1/2011 | Orberk et al. | |
| 10,897,225 B1 | 1/2021 | Strom et al. | |
| 2007/0046387 A1* | 3/2007 | Blum | H03B 5/1228 |
| | | | 331/117 FE |

(Continued)

FOREIGN PATENT DOCUMENTS

| | | | |
|---|---|---|---|
| WO | 2018005905 A1 | 1/2018 | |
| WO | 2020237097 A1 | 11/2020 | |

OTHER PUBLICATIONS

International Search Report and Written Opinion—PCT/US2023/061829—ISA/EPO—dated May 9, 2023.

*Primary Examiner* — Dac V Ha
(74) *Attorney, Agent, or Firm* — Patterson + Sheridan, L.L.P.

(57) ABSTRACT

Apparatus and methods for non-invasively monitoring an oscillation signal in an effort to provide a more reliable oscillation signal. An example oscillation circuit generally includes an oscillator configured to generate an oscillation signal, the oscillator comprising an oscillator core circuit for coupling to a resonator and configured to generate the oscillation signal to enable the resonator to resonate and an adjustable current source coupled to the oscillator core circuit and configured to control an amplitude of the oscillation signal; a first automatic gain control (AGC) circuit having an input coupled to an output of the oscillator and having an output coupled to a control input of the adjustable current source; a second AGC circuit configured to replicate the first AGC circuit; and logic having a first input coupled to the output of the first AGC circuit and having a second input coupled to an output of the second AGC circuit.

31 Claims, 10 Drawing Sheets

(56) References Cited

U.S. PATENT DOCUMENTS

| | | | |
|---|---|---|---|
| 2008/0143452 A1* | 6/2008 | Rosik | H03B 5/364 |
| | | | 331/158 |
| 2012/0068774 A1* | 3/2012 | Chen | H03B 5/36 |
| | | | 331/15 |
| 2017/0077931 A1* | 3/2017 | Viegas | H03L 3/00 |
| 2023/0020823 A1* | 1/2023 | Higuchi | H03H 9/00 |

* cited by examiner

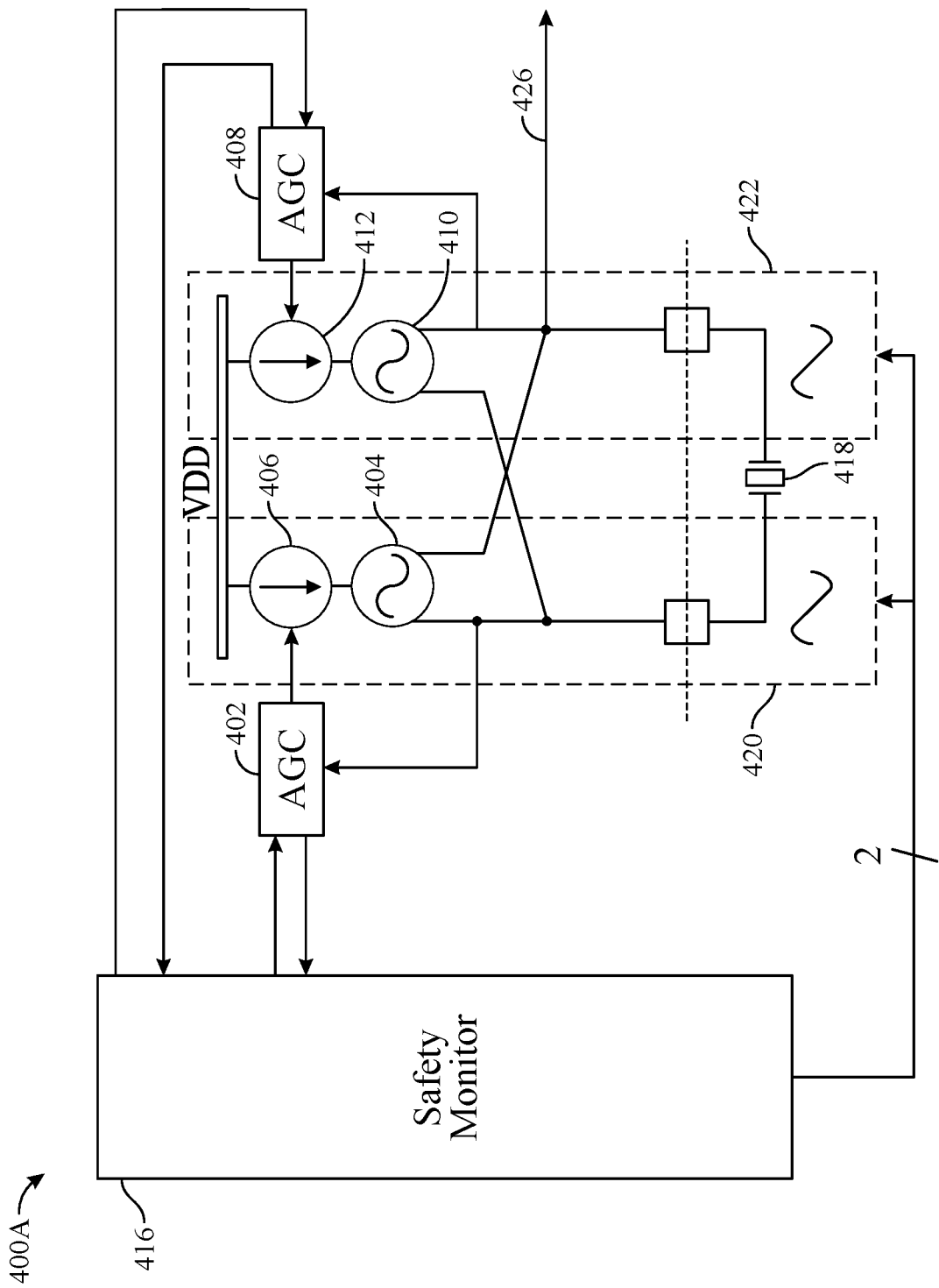

$$\begin{cases} \text{OUT} = (\text{REF} - \text{IN}) \times A \\ \text{OUT}_{REP} = \text{REF} \times A_{REP} \end{cases}$$

If $\text{OUT}_{REP} \geq \text{OUT}$ (= AGC_OK is high), $$\text{IN} \geq \text{REF} \times \left(1 - \frac{A_{REP}}{A}\right)$$

$$\frac{A_{REP}}{A} = \frac{m}{n}$$

OSCILLATION CIRCUIT WITH IMPROVED FAILURE DETECTION

TECHNICAL FIELD

Certain aspects of the present disclosure generally relate to electronic circuits and, more particularly, to circuitry for monitoring an oscillation signal.

BACKGROUND

Electronic devices include computing devices such as desktop computers, notebook computers, tablet computers, smartphones, wearable devices like a smartwatch, Internet servers, and so forth. These various electronic devices provide information, entertainment, social interaction, security, safety, productivity, transportation, manufacturing, and/or other services to human users. These various electronic devices depend on wireless communications for many of their functions and may generate and utilize one or more oscillating signals, for wireless communication and/or for clock signals for synchronous digital logic. An oscillating signal may be generated, for example, using a resonator (e.g., a quartz crystal or an inductor-capacitor (LC) tank, also referred to as a resonant tank) and an oscillating core circuit to enable the resonator to resonate.

Wireless communication may include various types of communication content such as voice, video, packet data, messaging, broadcast, and so on. Wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., IEEE 802.11), and the like. In order to transmit or receive data and/or control information, the radio frequency front end of a wireless communication device may include one or more frequency synthesizers to generate oscillating signals used for upconverting baseband signals and downconverting RF signals. For example, at least one of the frequency synthesizers may include a voltage-controlled oscillator (VCO) for tuning an oscillating signal to different frequencies.

To ensure reliable operation of electronic devices in many applications, oscillating signals should be robust in many applications, despite process, voltage, and temperature (PVT) variations. For example, it may be desirable for an oscillating signal to have a sufficiently high amplitude, despite oscillation circuit variations due to PVT.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure generally relate to techniques and apparatus for monitoring an oscillation signal.

Certain aspects provide an oscillation circuit. The circuit generally includes: an oscillator configured to generate an oscillation signal, the oscillator comprising an oscillator core circuit for coupling to a resonator and configured to generate the oscillation signal to enable the resonator to resonate and an adjustable current source coupled to the oscillator core circuit and configured to control an amplitude of the oscillation signal; a first automatic gain control (AGC) circuit having an input coupled to an output of the oscillator and having an output coupled to a control input of the adjustable current source; a second AGC circuit configured to replicate the first AGC circuit; and logic having a first input coupled to the output of the first AGC circuit and having a second input coupled to an output of the second AGC circuit.

Certain aspects provide a method of oscillation monitoring. The method generally includes generating an oscillation signal with an oscillator driving a resonator, generating a first signal with a first AGC circuit based on the oscillation signal, controlling a bias current for the oscillator based on the first signal, generating a second signal with a second AGC circuit, the second AGC circuit replicating the first AGC circuit, and effectively monitoring the oscillation signal based on the first signal and the second signal.

Certain aspects provide an apparatus with oscillation monitoring. The apparatus generally includes means for generating an oscillation signal; means for generating a first AGC signal based on the oscillation signal; means for controlling a bias current for the means for generating the oscillation signal, based on the first AGC signal; means for generating a second AGC signal, the means for generating the second AGC signal replicating the means for generating the first AGC signal; and means for effectively monitoring the oscillation signal based on the first AGC signal and the second AGC signal.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 4A is a block diagram of an example oscillation circuit with a main oscillator and a backup oscillator, in which aspects of the present disclosure may be practiced.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
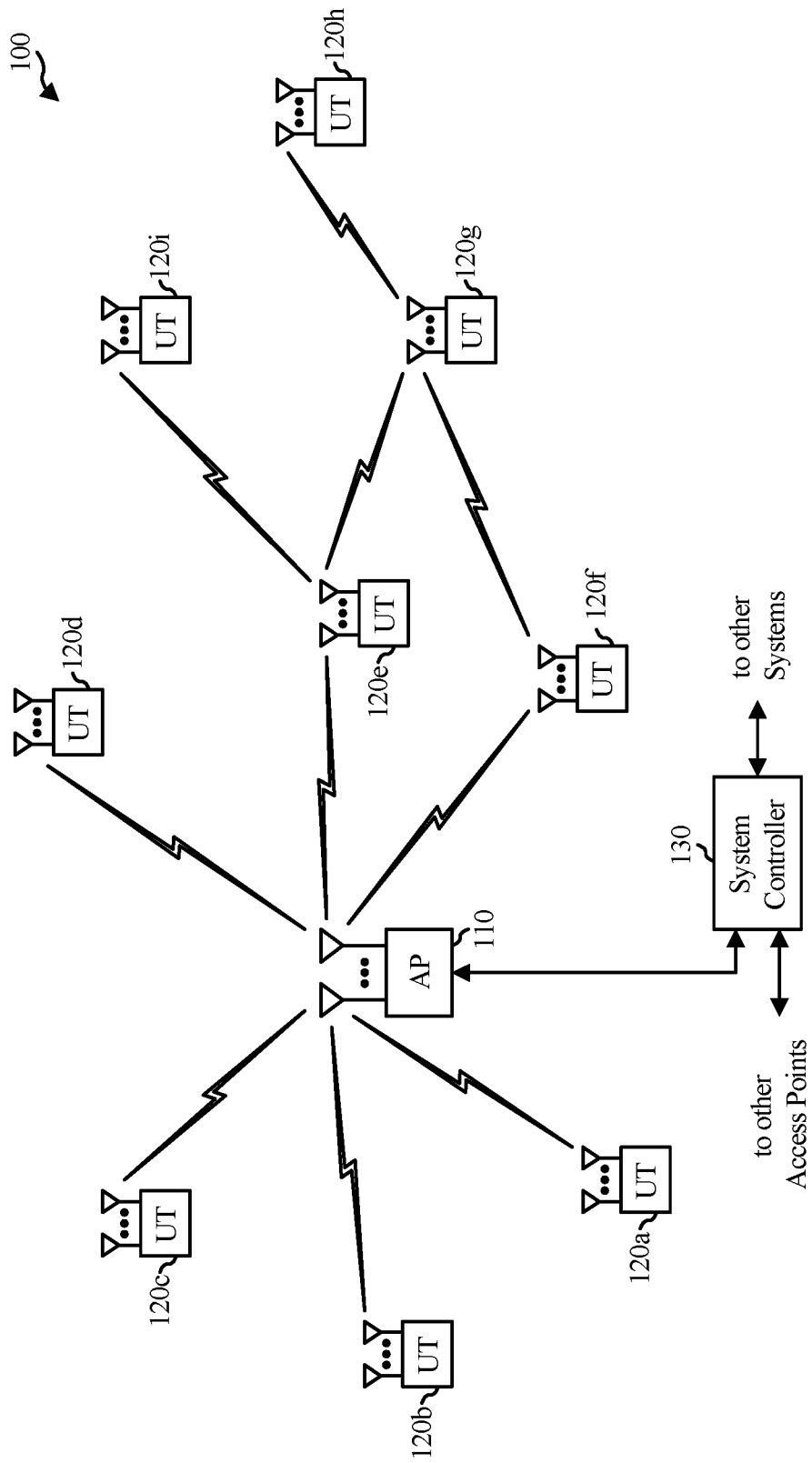
FIG. 1 is a diagram of an example wireless communications network, in which aspects of the present disclosure may be practiced.

Certain aspects of the present disclosure generally relate to techniques and apparatus for monitoring an oscillation signal in a non-invasive manner. In this scheme, oscillation signal amplitude and automatic gain control (AGC) circuit gain may be evaluated without monitoring. For example, a main automatic gain control (AGC) circuit and a replica AGC circuit may be used to evaluate oscillation signal amplitude and AGC circuit gain without sensing the oscillation signal amplitude. Constructed of transistors fabricated with the same semiconductor process and powered by the same voltage rail, the main and replica AGC circuits may each use a constant transconductance bias generator to self-generate a reference that is dependent on process, voltage, and temperature (PVT). In this manner, a process-tracking threshold (e.g., an AGC output current amplitude threshold) is effectively generated, against which the main AGC circuit is tested, rather than using a fixed threshold. In this manner, weak failures (where the oscillation signal amplitude has just started to decrease, but may still allow the apparatus using the oscillation signal to function) may be detected earlier (and in some cases corrected by switching to a backup oscillator) before a more serious failure occurs (e.g., where the apparatus cannot function. Therefore, certain aspects of the present disclosure may provide a more robust oscillation signal.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a circuit for monitoring an oscillation signal, as described in more detail herein.

Figure 2:
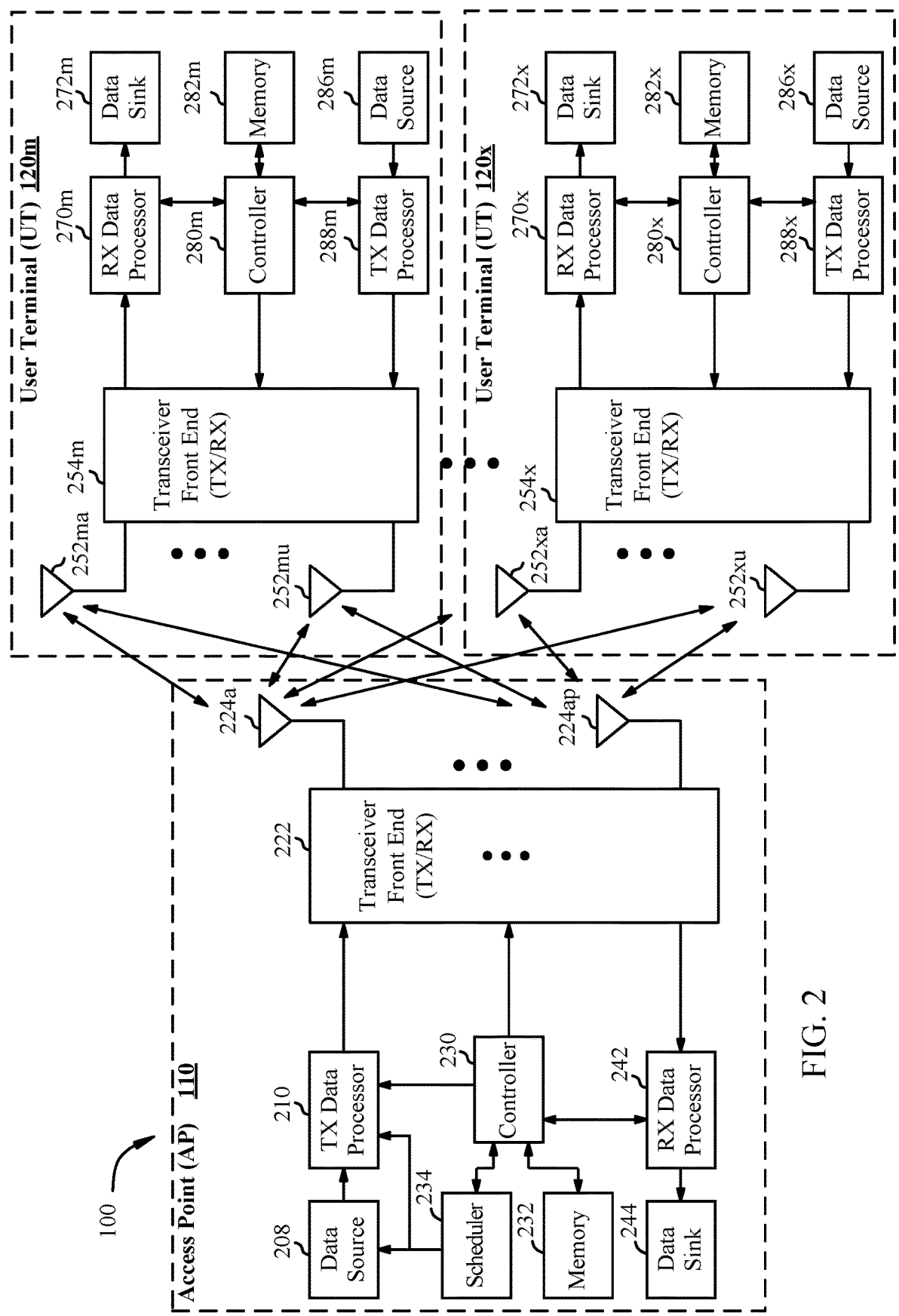
FIG. 2 is a block diagram of an example access point (AP) and example user terminals, in which aspects of the present disclosure may be practiced.

FIG. 2 shows a block diagram of access point 110 and two user terminals 120m and 120x in wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

In certain aspects, the transceiver front end (TX/RX) 222 of access point 110 and/or the transceiver front end 254 of user terminal 120 may include one or more frequency synthesizers to generate oscillating signals used for signal transmission and/or reception. In certain aspects, the controller 230 of access point 110 and/or the controller 280 of user terminal 120 may include or be coupled to an oscillation circuit for generating oscillating signals used for clocking synchronous logic. At least one of the frequency synthesizers and/or at least one of the oscillation circuits may include or be coupled to a circuit for monitoring an oscillation signal, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
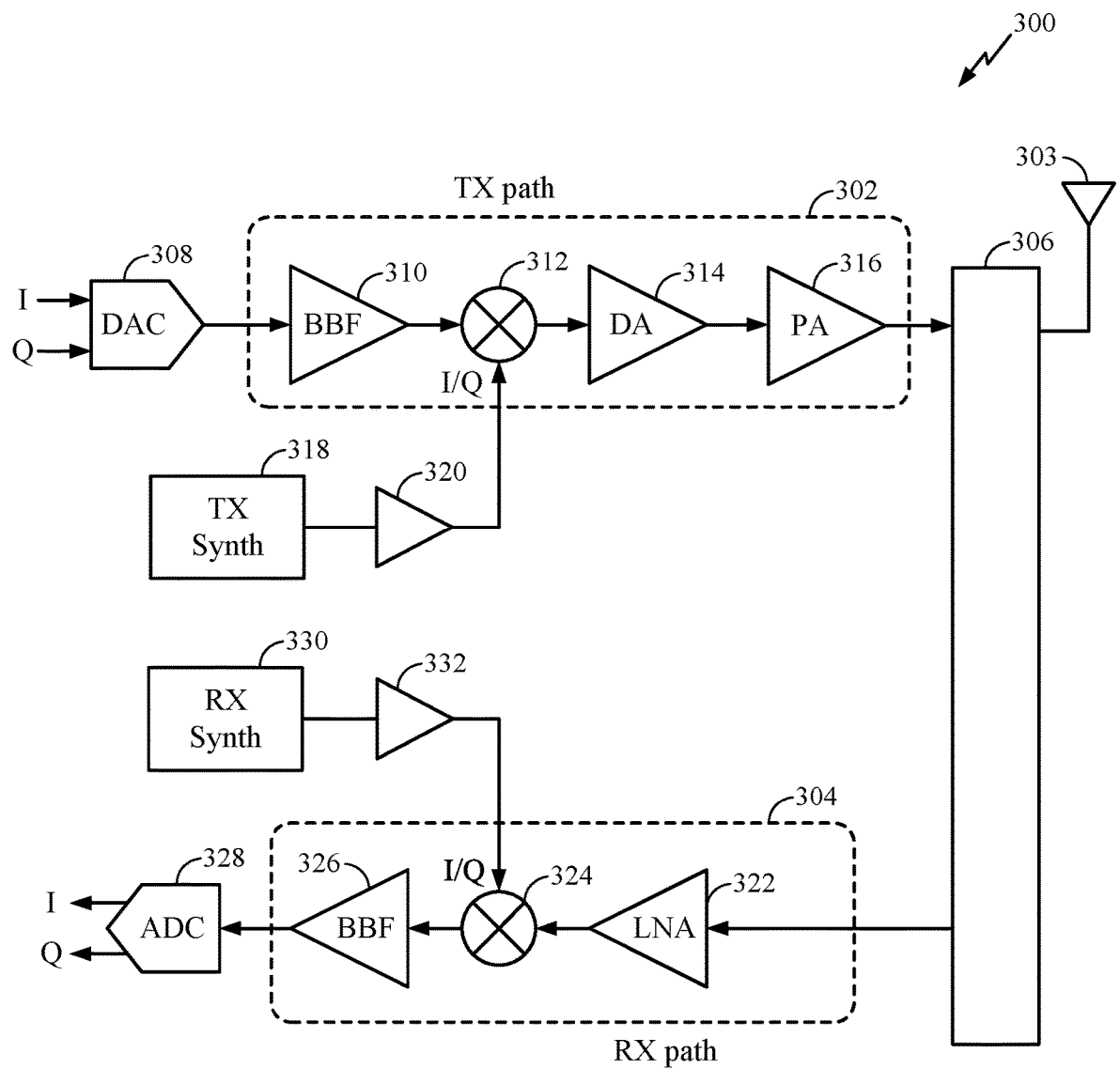
FIG. 3 is a block diagram of an example transceiver circuit, in which aspects of the present disclosure may be practiced.

FIG. 3 is a block diagram of an example transceiver circuit 300, such as transceiver front ends 222, 254 in FIG. 2, in which aspects of the present disclosure may be practiced. The transceiver circuit 300 includes at least one transmit (TX) path 302 (also known as a "transmit chain") for transmitting signals via one or more antennas and at least one receive (RX) path 304 (also known as a "receive chain") for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in one or more radio frequency integrated circuits (RFICs). The PA 316 may be external to the RFIC(s) for some implementations.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency-conversion process produces the sum and difference frequencies of the LO frequency and the frequency of the signal of interest. The sum and difference frequencies are referred to as "beat frequencies." The beat frequencies may be in the RF range, such that the signals output by the mixer 312 may be RF signals, which may be amplified by the DA 314 and/or by the PA 316 before transmission by the antenna 303. While one mixer 312 is illustrated, several mixers may be used to upconvert the filtered baseband signals to one or more intermediate frequencies and to thereafter upconvert the intermediate frequency (IF) signals to a frequency for transmission.

The RX path 304 includes a low noise amplifier (LNA) 322, a mixer 324, and a baseband filter (BBF) 326. The LNA 322, the mixer 324, and the BBF 326 may be included in one or more RFICs, which may or may not be the same RFIC(s) that include the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

Certain transceivers may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In certain aspects, the TX frequency synthesizer 318 and/or the RX frequency synthesizer 330 may include or be coupled to a circuit for monitoring an oscillation signal, as described in more detail herein.

While FIGS. 1-3 provide a wireless communication system as an example application in which certain aspects of the present disclosure may be implemented to facilitate understanding, certain aspects described herein may be used for monitoring an oscillation signal in any of various other suitable systems.

An Example Oscillation Circuit with Improved Failure Detection

Electronic devices (e.g., wireless communication devices) may include oscillation circuits and performance monitoring systems to ensure robust operation in the oscillation circuits and to switch to backup circuitry, if indicated. In certain oscillation circuits (e.g., oscillation circuits in automotive safety systems), non-invasive performance monitoring systems are desirable. One or more automatic gain control (AGC) circuits may serve as a first-order monitor of the oscillation circuit. The AGC circuit may monitor an amplitude of the output signal of an oscillator in the oscillation circuit and regulate a bias current of the oscillator based on the amplitude of the output signal.

FIG. 4A is a block diagram of an example oscillation circuit 400A. The oscillation circuit 400A may include a first AGC circuit 402, a second AGC circuit 408, a safety monitor 416, a resonator 418, a first oscillator 420 (e.g., a main oscillator), and a second oscillator 422 (e.g., a backup oscillator). The first oscillator 420 may include a first oscillator core circuit 404 and a first current source 406, and the second oscillator 422 may include a second oscillator core circuit 410 and a second current source 412. The first and second oscillator core circuits 404, 410 may be coupled to the resonator 418 and configured to generate an oscillation signal to enable the resonator 418 to resonate. The first and second oscillator core circuits 404, 410 may include any suitable type of oscillator core, such as a crystal oscillator core, for driving the resonator. An output node 426 of the oscillation circuit 400A may provide a clock signal to one or more other systems.

As shown, the first AGC circuit 402 may have an input coupled to an output of the first oscillator 420 and may have an output coupled to a control input of the first current source 406. Similarly, the second AGC circuit 408 may have an input coupled to an output of the second oscillator 422 and may have an output coupled to a control input of the second current source 412. The first current source 406 and the second current source 412 may be adjustable current sources.

The first AGC circuit 402 may be configured to monitor the amplitude of the signal output from the first oscillator 420. In one example case, if the first AGC circuit 402 senses that the amplitude of the signal output by the first oscillator 420 is too low, the first AGC circuit 402 may control the first current source 406 to increase the current supplied to the first oscillator core circuit 404. The second AGC circuit 408 may be configured to monitor the amplitude of the signal output from the second oscillator 422 and control the second current source 412 in a similar manner.

If one of the AGC circuits 402 and 408 fails, the oscillation circuit 400A may be left without a first-order monitoring system to monitor the health of the oscillators 420 and 422. Accordingly, the first AGC circuit 402 and the second AGC circuit 408 may both be communicatively coupled to the safety monitor 416. The safety monitor 416 may be configured to monitor the performance (e.g., the health) of the first AGC circuit 402 and the second AGC circuit 408. In certain aspects, the safety monitor 416 may send an inquiry to (e.g., ping) each of the first AGC circuit 402 and the second AGC circuit 408. In response to the inquiry, the first AGC circuit 402 and/or the second AGC circuit 408 may respond with a status signal indicating whether each AGC circuit is functional and operating correctly. For other aspects, the first AGC circuit 402 and/or the second AGC circuit 408 may periodically or continuously send such a status signal to the safety monitor 416.

The oscillation circuit 400A (and more specifically, the safety monitor 416) may select between the signal generated by the first oscillator 420 and the signal generated by the second oscillator 422 as the output signal at the output node 426. In certain aspects, the safety monitor 416 may output (e.g., via a bus) a first enable signal for enabling and/or disabling the first oscillator 420 and a second enable signal for enabling and/or disabling the second oscillator 422, as shown in FIG. 4A. In certain aspects, for example, the first oscillator 420 may be initially enabled, while the second oscillator 422 may be initially disabled. If the first AGC circuit 402 fails (e.g., as indicated by its associated status signal), or if the first AGC circuit 402 detects a failure from the first oscillator 420, the safety monitor 416 may indicate (e.g., via the enable signals) for the oscillation circuit 400A to switch to using the signal generated by the second oscillator 422 as the output signal (e.g., the safety monitor 416 may disable the first oscillator 420 and enable the second oscillator 422). Accordingly, the first oscillator 420 may be considered as the main oscillator, and the second oscillator 422 may be considered as the backup oscillator.

In an example, the oscillation circuit 400A may include additional circuitry (not shown) configured to monitor the output signal of the first oscillator 420 at the output node 426. In response to a detected failure at this location, the oscillation circuit 400A may switch to using the signal generated by the second oscillator 422 as the output signal. However, sensing the output node 426 of the oscillation circuit 400A may introduce frequency shift and/or phase noise degradation into the oscillation signal. In one example, the additional circuitry may include a clock halt detector. However, halt detectors are generally configured to monitor for complete clock failures (e.g., after the clock signal has already been lost), which may lead to the failure detection occurring too late.

Figure 4B:
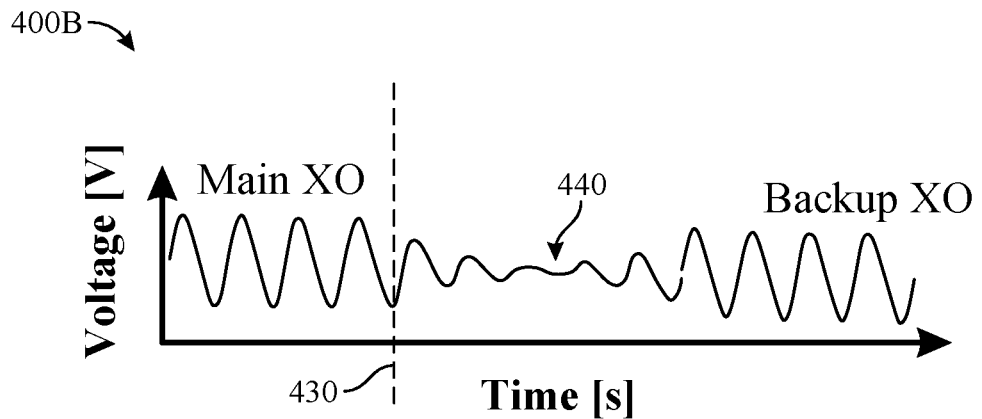
FIG. 4B is a graph illustrating an example of detecting a system failure after an output oscillating signal of the system is lost.

FIG. 4B is a graph 400B illustrating an example of detecting a failure after an output signal (e.g., the signal at the output node 426) of an oscillator (e.g. the first oscillator 420) is lost. As shown, before a time 430, the system may operate using a main oscillator (e.g., the first oscillator 420). At time 430, the main oscillator core circuit (e.g., the first oscillator core circuit 404) may fail, and the output signal may begin to droop (e.g., the amplitude of the output signal may decrease). As illustrated, the system (and more specifically, circuitry such as a clock halt detector) may not detect the failure until a time 440 when the output signal has drooped significantly (e.g., has been lost). Once the failure is detected, the system may switch to a backup oscillator (e.g., the second oscillator 422). However, once the output signal is lost, even if the system switches to the backup oscillator, other systems that use the output signal may be reset, restarted, or in an unintentional state, which is undesirable.

Figure 4C:
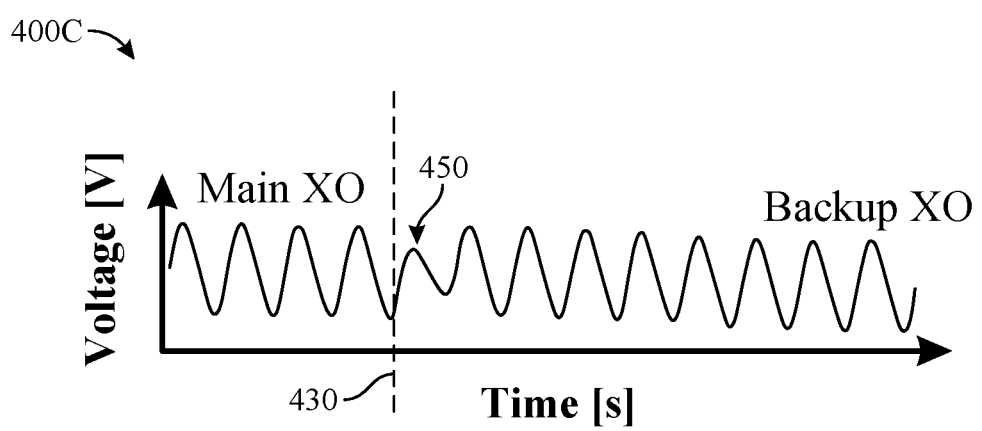
FIG. 4C is a graph illustrating improved failure detection where a system failure is detected before the output oscillating signal of the system is lost, in accordance with certain aspects of the present disclosure.

Accordingly, certain aspects of the present disclosure provide a system with improved failure detection where the failure may be detected before the output signal is lost. FIG. 4C is a graph 400C illustrating an example of improved failure detection, in accordance with certain aspects of the present disclosure. As shown, when the main oscillator fails at time 430, the system with improved failure detection detects the failure at a time 450, before the output signal is lost. As a result, the system is able to switch to the backup oscillator before the output signal is lost, thereby avoiding undesirable consequences for other components that use the output signal as a clock signal.

To achieve this improved failure detection, aspects of the present disclosure provide apparatus and techniques for using an output of an AGC circuit (as opposed to an output of the oscillator) and logic (as opposed to a halt detector, for example) to monitor the health of the oscillator core circuit.

Several methods exist for monitoring the health of the oscillator core circuit and the AGC circuit based on an output of the AGC circuit. However, these methods tend to be invasive, unreliable, and/or negatively affect performance of the oscillation circuit. For example, one method involves breaking the feedback loop between the oscillator and the AGC circuit, and verifying the gain of the AGC circuit using a test input signal with a known amplitude. However, this invasive method may only be used when the oscillation system is in a factory test mode (as opposed to a mission mode) and does not provide real-time failure detection in mission mode. Another method involves using an analog-to-digital converter (ADC) to measure the amplitude of the AGC input signal, but the ADC may generate kickback noise that can cause a frequency shift and/or phase noise degradation in the oscillation circuit. The ADC also consumes additional power and occupies additional area. Yet another method involves monitoring only the amplitude of the output signal of the AGC circuit. In this case, only the output amplitude (not the input amplitude) is known, so the gain cannot be accurately calculated. This method may not be reliable because the amplitude of the AGC output signal is sensitive to variations in process, voltage, and temperature (PVT) conditions, so a monitoring system may not be able to catch all failures across PVT variations.

Figure 5A:
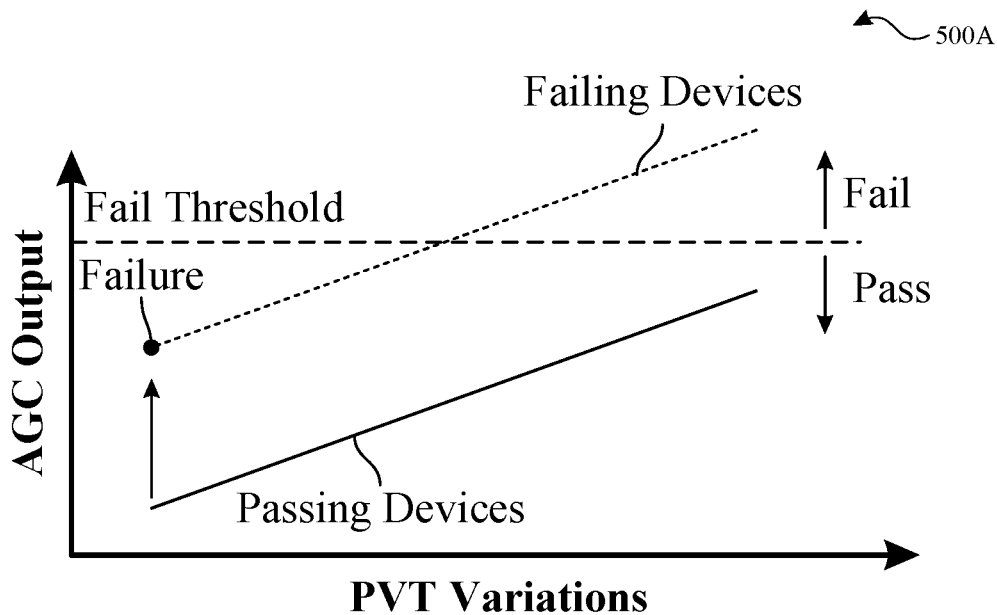
FIG. 5A is a graph illustrating a constant failure threshold for an automatic gain control (AGC) circuit output that does not change in response to process, voltage, and temperature (PVT) variations.

For example, FIG. 5A is a graph 500A illustrating a constant failure threshold for an AGC circuit output that does not change in response to PVT variations. In this case, a fixed threshold value for the AGC output may be set high enough to avoid false failures across PVT variations. As illustrated, when a constant threshold is used to indicate a failure, the system may be unable to detect the failure across all PVT variations. That is, an amplitude of the output of an AGC circuit may be below the failure threshold (a passing indication) at certain PVT conditions, even when the oscillation circuit (and, more specifically, the AGC circuit and/or an oscillator core circuit of the oscillation circuit) is failing. The constant failure threshold may therefore cause the monitoring system to generate a false "passing" indication. Furthermore, using a constant threshold value cannot detect a situation referred to as a "weak failure"—in which the oscillation circuit is still functional, but performance has been degraded (e.g., in terms of phase noise and/or frequency accuracy)—across PVT variations.

Figure 5B:
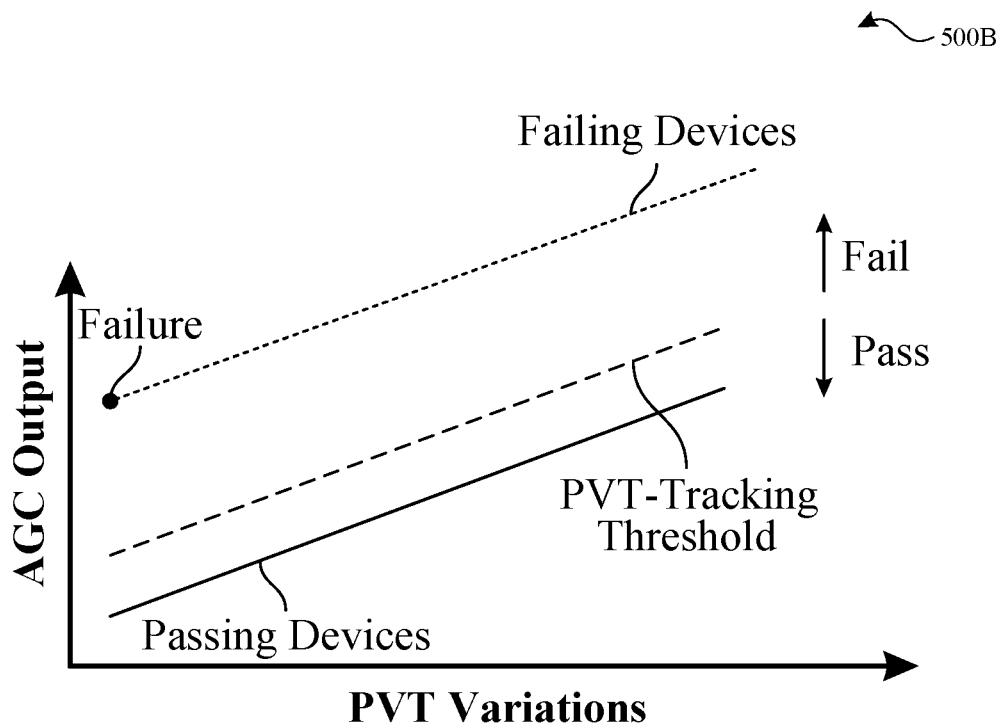
FIG. 5B is a graph illustrating a failure threshold for the AGC circuit output that changes in response to PVT variations, in accordance with certain aspects of the present disclosure.

Accordingly, certain aspects of the present disclosure provide techniques and apparatus for detecting failure based on the output of the AGC circuit that takes into consideration the PVT variations of the system and effectively provide a PVT-tracking threshold for oscillation monitoring. FIG. 5B is a graph 500B illustrating a failure threshold for the AGC circuit output that changes in response to PVT variations, in accordance with certain aspects of the present disclosure. The PVT-tracking threshold may allow the system to avoid false passes and to detect even "weak" failures (e.g., before the clock signal is lost, as at time 450 in FIG. 4C) regardless of PVT variations. The PVT-tracking threshold may effectively be self-generated by a constant-transconductance bias generator, discussed further below.

Figure 6:
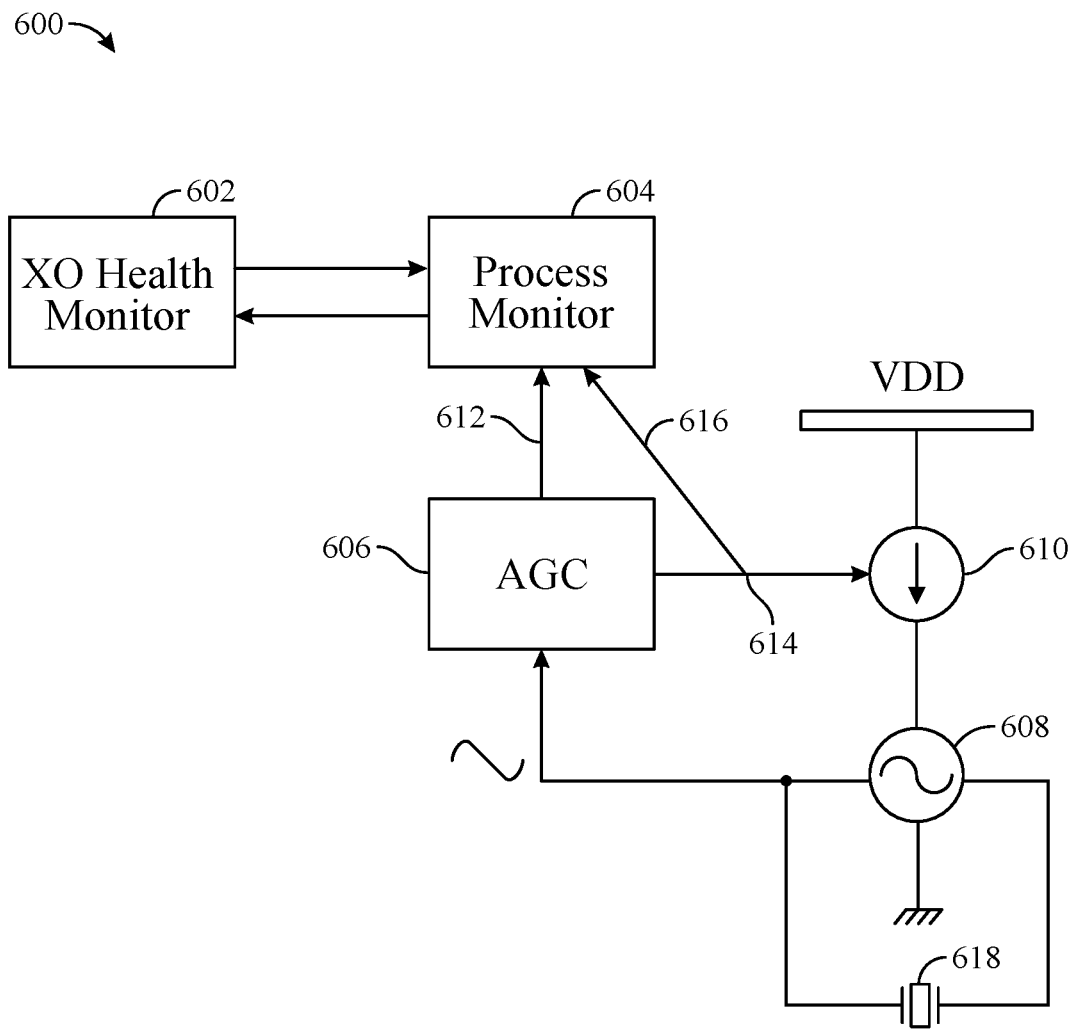
FIG. 6 is a block diagram of an example oscillation circuit including a process monitor coupled to an AGC circuit, in accordance with certain aspects of the present disclosure.

FIG. 6 is a block diagram of an example oscillation circuit 600, in accordance with certain aspects of the present disclosure. The oscillation circuit 600 may be similar to the oscillation circuit 400A, but with a process monitor 604 (also referred to herein as "logic"). In addition to the process monitor 604, the oscillation circuit 600 may generally include an oscillator health monitor 602, an AGC circuit 606, an oscillator core circuit 608, a current source 610, and a resonator 618. The oscillator core circuit 608 and the current source 610 may compose an oscillator, such as oscillator 420 or 422 in FIG. 4A. In certain aspects, at least a portion of the process monitor 604 may be integrated with the AGC circuit 606.

The oscillator core circuit 608 may be configured to generate an oscillation signal to enable the resonator 618 to resonate. The current source 610 may be adjustable and may be configured to control an amplitude of the oscillation signal by providing an adjustable bias current.

The AGC circuit 606 may have an input coupled to an output of the oscillator core circuit 608. The AGC circuit 606 may be configured to output, at 614, a first output signal to control the current source 610 as described above with reference to FIG. 4A. Additionally, as illustrated at 616, the first output signal may also be used as a first input of the process monitor 604. The AGC circuit 606 may be further configured to output, at 612, a second output to be used as a second input of the process monitor. The second output of the AGC circuit 606 may be a replica output that is produced by a replica AGC circuit configured to replicate a primary AGC circuit in the AGC circuit 606, as described below. For example, the replica AGC circuit may have the same or a similar topology as the main AGC circuit and may be fabricated using the same semiconductor process as the main AGC circuit.

The oscillator health monitor 602 may be configured to check (e.g., periodically, intermittently, or continuously) if the oscillator is functioning properly (e.g., is generating an adequate output signal). For example, the oscillator health monitor 602 may send a request to (e.g., ping) the process monitor 604 for an indication regarding the health of the oscillator. The process monitor 604 may be configured to compare the first output signal (e.g., at 616) and the second output signal (e.g., at 612) of the AGC circuit 606, and report the comparison to the oscillator health monitor 602. Accordingly, the process monitor 604 may be configured to effectively monitor the oscillation signal generated by the oscillator based on the two outputs of the AGC circuit 606. In this manner, AGC amplitude and gain are evaluated without monitoring the AGC input amplitude. Instead, the AGC output amplitude is monitored with process-tracking amplitude sensing, as explained below.

Figure 7A:
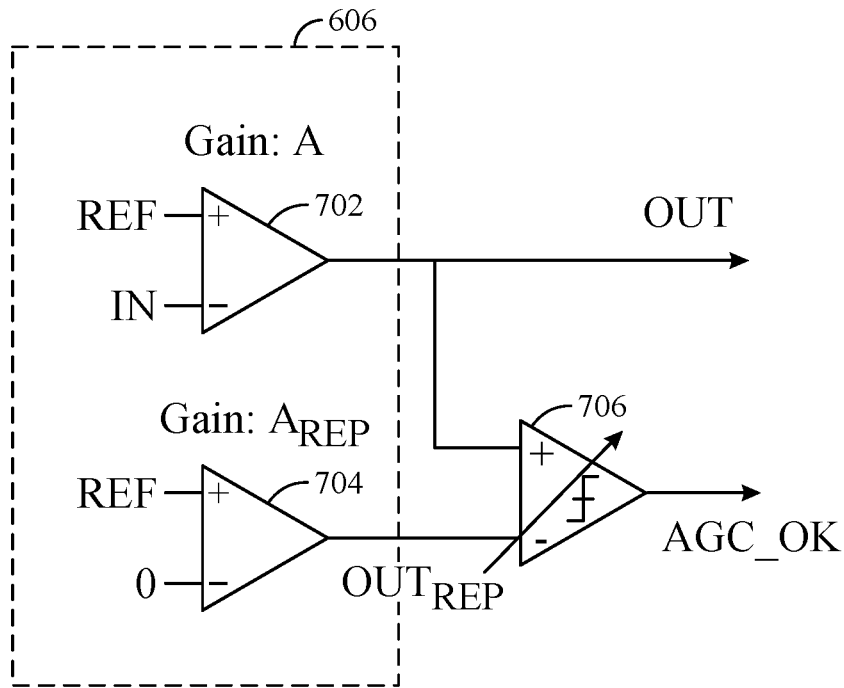
FIG. 7A is a block diagram of an example implementation of the process monitor and the AGC circuit of FIG. 6, in accordance with certain aspects of the present disclosure.

FIG. 7A is a block diagram of an example implementation of the process monitor 604 and the AGC circuit 606 of FIG. 6, in accordance with certain aspects of the present disclosure. The AGC circuit 606 may include a first AGC circuit 702 and a second AGC circuit 704 configured to replicate the first AGC circuit 702. The process monitor 604 may include a comparator 706, which may be tunable. The comparator 706 may have a first input (e.g., the negative input) coupled to the output of the first AGC circuit 702 and may have a second input (e.g., the positive input) coupled to the output of the second AGC circuit 704. The comparator 706 may be configured to compare the output signals from the first AGC circuit 702 and the second AGC circuit 704 to determine whether the oscillation circuit 600 (and, more specifically, the AGC circuit 606 and/or the oscillator core circuit 608) is failing.

The output of the first AGC circuit 702 (labeled "OUT") may be determined as $$OUT=(REF-IN)*A$$

where IN is an input signal of the first AGC circuit 702 (the output signal from the oscillator), and A is a gain of the first AGC circuit 702. REF may be a self-generated reference signal. That is, the oscillation circuit (e.g., the first AGC circuit 702 and the second AGC circuit 704) may generate REF via a constant-transconductance bias generator.

When the oscillation circuit is functioning properly, the amplitude of the input signal IN will sufficiently high, and the amplitude of the output signal OUT will be relatively low (due to the decreased difference between REF and IN). Accordingly, the health of the oscillation circuit may be monitored in some cases by monitoring the output of the first AGC circuit 702 and determining when the output signal OUT is sufficiently high.

One example method for monitoring when the output signal OUT is sufficiently high involves comparing the output signal OUT with another signal (e.g., a threshold). As explained with respect to FIGS. 5A and 5B, having the threshold vary according to PVT variations is desirable so that weak failures may be detected across PVT conditions. Accordingly, certain aspects of the present disclosure provide a method for comparing the output signal OUT with a replica output signal from the second AGC circuit 704. The output of the second AGC circuit 704 (labeled "OUT$_{REP}$") may be determined as $$OUT_{REP}=REF*A_{REP}$$

where $A_{REP}$ is a gain of the second AGC circuit 704. Because the second AGC circuit 704 is configured to replicate the first AGC circuit 702, the output signal OUT$_{REP}$ will vary according to PVT in a manner similar to the output signal OUT, thereby providing a PVT-dependent threshold. Thus, a relative comparison between OUT and OUT$_{REP}$ is performed, as opposed to an absolute comparison to a fixed threshold.

The comparator 706 may be configured to effectively monitor the oscillation signal generated by the oscillator (e.g., the oscillator core circuit 608 and the current source 610 in FIG. 6) based on the output of the first AGC circuit 702 and the output of the second AGC circuit 704. Accordingly, the oscillation circuit may be able to effectively monitor the oscillation signal generated by the oscillator without directly sensing an amplitude of the oscillation signal. According to certain aspects, the comparator 706 may be configured to compare the output signal OUT with the output signal OUT$_{REP}$, and output (labeled "AGC_OK") a logic high signal (e.g., logic 1) when an amplitude of OUT$_{REP}$ is greater than or equal to an amplitude of OUT, thereby indicating that the oscillation circuit is functioning properly.

Based on the above equations and this circuit setup, the comparator 706 should indicate the oscillation circuit is okay (AGC_OK=1) when OUT$_{REP}$ is greater than or equal to OUT. In this situation, $$REF*A_{REP} \geq (REF-IN)*A$$

Rearranging these equations to solve for IN leads to the following equation:

$$IN \geq REF*\left(1-\frac{A_{REP}}{A}\right)$$

Therefore, the gain ratio of $A_{REP}$ to A may be set such that this equation is true when the amplitude of IN is acceptable (e.g., when the oscillation circuit, and more specifically the oscillator core circuit and the AGC circuit are functioning properly).

The ratio of the gain of the second AGC circuit 704 to the gain of the first AGC circuit 702 (e.g., the ratio of $A_{REP}$ to A) may be calculated as $$\frac{A_{REP}}{A} = \frac{m}{n}$$

where n depends on a transistor size ratio between transistors in the first AGC circuit 702 and in the comparator 706, and m depends on a transistor size ratio between transistors in the second AGC circuit 704 and in the comparator 706, as discussed further below. Accordingly, the gain ratio of $A_{REP}$ to A may be set by designing (and in some cases adjusting during factory calibration) transistor sizes in the first AGC circuit 702, the second AGC circuit 704, and the comparator 706, as discussed further below.

Figure 7B:
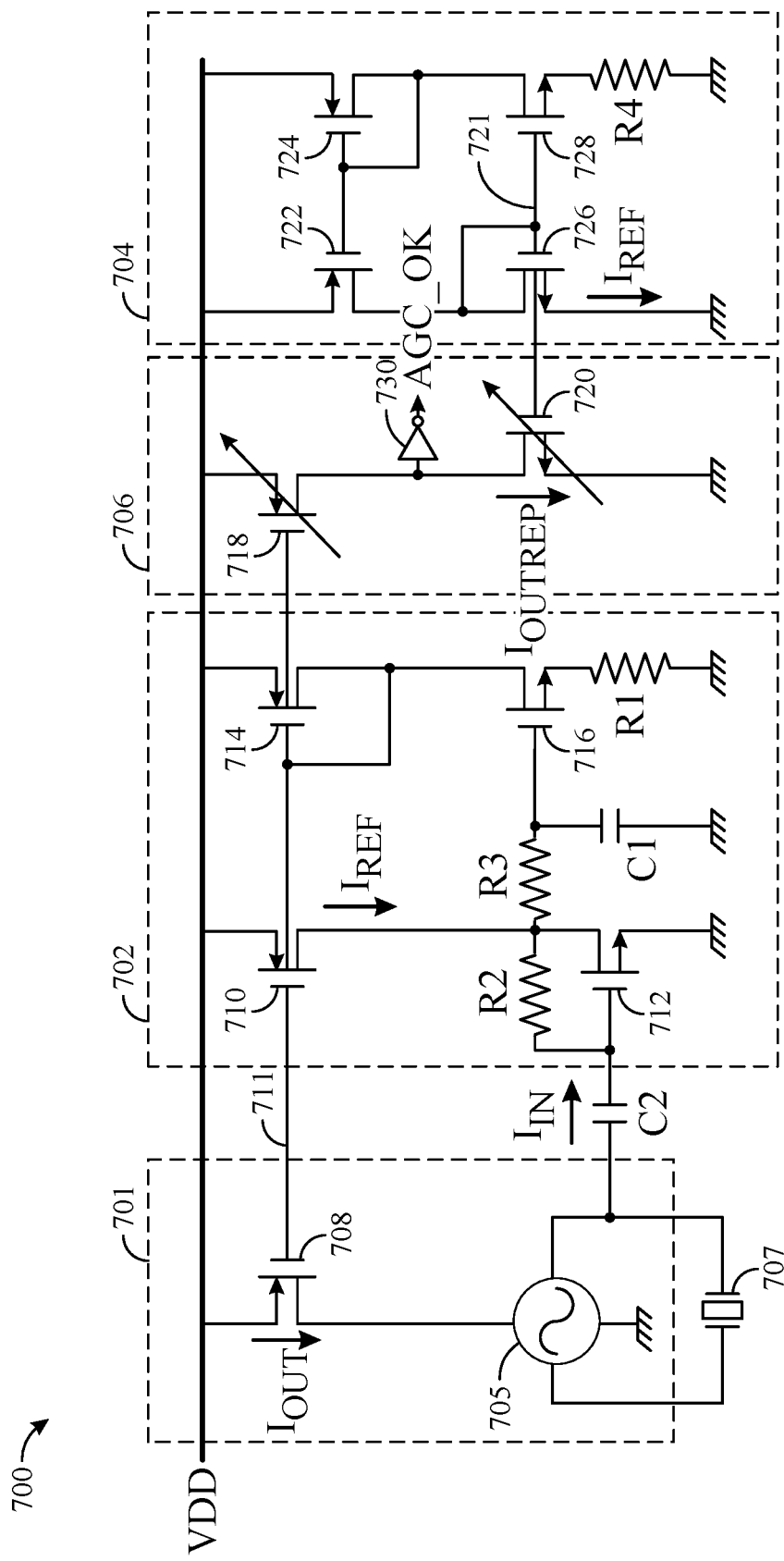
FIG. 7B is a schematic diagram of an example implementation of the process monitor and the AGC circuit of FIGS. 6 and 7A, in accordance with certain aspects of the present disclosure.

FIG. 7B is a schematic diagram of an oscillation circuit 700 with an example implementation of the first AGC circuit 702, the second AGC circuit 704, and the comparator 706 of FIG. 7A, in accordance with certain aspects of the present disclosure. As shown, the oscillation circuit 700 also includes an oscillator 701 coupled to the first AGC circuit 702.

The oscillator 701 may be similar to the oscillator 420 or 422 in FIG. 4A, and may include an adjustable current source (implemented by transistor 708, for example), and an oscillator core circuit 705 having an input coupled to a drain of transistor 708 and having an output coupled to a resonator 707. The oscillator 701 may be configured to generate an oscillation signal. More specifically, the oscillator core circuit 705 may be configured to generate the oscillation signal to enable the resonator 707 to resonate. The adjustable current source (implemented by transistor 708) may be configured to provide an adjustable bias current (labeled "$I_{OUT}$") to control an amplitude of the oscillation signal.

The comparator 706 may include a first transistor 718, a second transistor 720, and an inverter 730. The comparator 706 may have a first input (e.g., a gate of transistor 718) coupled to an output of the first AGC circuit 702 (e.g., a node 711 coupled to a gate of transistor 708), and a second input (e.g., a gate of transistor 720) coupled to an output of the second AGC circuit 704 (a node 721). The transistor 718 may be a p-type transistor and may have a source coupled to a power rail (labeled "VDD") of the oscillation circuit 700. The transistor 720 may be an n-type transistor, which may have a source coupled to a reference potential node (e.g., electrical ground) for the oscillation circuit 700 and may have a drain coupled to a drain of the transistor 718. In some examples, at least one of the transistor 718 and the transistor 720 may be tunable. The inverter 730 may have an input coupled to the drain of the transistor 718 and to the drain of the transistor 720, and an output coupled to an output of the comparator 706 (labeled "AGC_OK").

The first AGC circuit 702 may have an input coupled to an output of the oscillator 701 and may have an output (e.g., at node 711) coupled to a control input of the adjustable current source (e.g., a gate of the transistor 708). The first AGC circuit 702 may include a first transistor 710 having a source coupled to the power rail. The transistor 710 may be a p-type transistor. The first AGC circuit 702 may also include a second transistor 712 having a source coupled to the reference potential node and having a drain coupled to a drain of the transistor 710. The transistor 712 may be an n-type transistor. The first AGC circuit 702 may also include a third transistor 714 having a source coupled to the power supply rail and having a gate coupled to a drain of the transistor 714, to a gate of the transistor 710, and to a gate of the transistor 718 of the comparator 706. The transistor 714 may be a p-type transistor. The first AGC circuit 702 may also include a fourth transistor 716 having a drain coupled to the drain and the gate of the transistor 714. The transistor 716 may be an n-type transistor. The first AGC circuit 702 may also include a first resistive element R1 coupled between a source of the transistor 716 and the reference potential node.

In some examples, the first AGC circuit 702 may further include a second resistive element R2 coupled between a gate of the transistor 712 and the drain of the transistor 712, and a third resistive element R3 coupled between the drain of the transistor 712 and a gate of the transistor 716. In some examples, the first AGC circuit 702 may also include a first capacitive element C1 coupled between the gate of the transistor 716 and the reference potential node. According to certain aspects, the transistor 710, the transistor 712, the transistor 714, the transistor 716, the first resistive element R1, the second resistive element R2, and the third resistive element R3 form at least part of a constant transconductance bias generator configured to generate a reference current (labeled "$I_{REF}$") that is dependent on process, voltage, and temperature (PVT). The reference current is represented by REF in the equations above described with respect to FIG. 7A.

According to certain aspects, the oscillation circuit 700 may also include a second capacitive element C2 coupled between the gate of the transistor 712 and the output of the oscillator 701. The second capacitive element C2 may be used to AC couple the output of the oscillator 701 to the input of the first AGC circuit 702.

The second AGC circuit 704 may be configured to replicate the first AGC circuit 702. For example, the second AGC circuit 704 may have the same or a similar topology as the first AGC circuit 702 and may be fabricated using the same semiconductor process as the first AGC circuit 702. The second AGC circuit 704 may include a first transistor 722 having a source coupled to the power supply rail, and a second transistor 726 having a source coupled to the reference potential node and a drain coupled to a drain of the transistor 722, to a gate of the transistor 726, and to a gate of the transistor 720 (e.g., to node 721). The transistor 722 may be a p-type transistor, and the transistor 726 may be an n-type transistor. The second AGC circuit 704 may also include a third transistor 724 having a source coupled to the power supply rail and having a drain coupled to a gate of the transistor 724 and to a gate of the transistor 722. The transistor 724 may be a p-type transistor. The second AGC circuit 704 may also include a fourth transistor 728 having a drain coupled to the drain and the gate of the transistor 724 and having a gate coupled to the gate and the drain of transistor 726, and a resistive element R4 coupled between a source of the transistor 728 and the reference potential node. The transistor 728 may be an n-type transistor.

The transistor 722, the transistor 726, the transistor 724, and the transistor 728 form at least part of another constant transconductance bias generator configured to generate another reference current (also labeled "$I_{REF}$"). According to certain aspects and as shown in FIG. 7B, an input of the second AGC circuit 704 is open-circuited, such that the input of the second AGC circuit 704 is configured to have zero current. In this manner, the second AGC circuit 704 amplifies the difference between REF and 0, as illustrated in FIG. 7A.

According to certain aspects, a transistor size ratio between the transistor 720, the transistor 726, and the transistor 728 may be m:1:1 (where m≥1), and a transistor size ratio between the transistor 718, the transistor 710, and the transistor 714 may be n:1:1 (where n≥1). The value of m may represent the gain of the second AGC circuit 704, and the value of n may represent the gain of the first AGC circuit 702 (or at least the ratio of m to n may be considered to represent the ratio of $A_{REF}$ to A). Accordingly, as mentioned above, the ratio of the gain of the second AGC circuit 704 (e.g., $A_{REF}$) to the gain of the first AGC circuit 702 (e.g., A) may be set by adjusting transistor sizes in the first AGC circuit 702, the second AGC circuit 704, and the comparator 706.

As described above, the first AGC circuit 702 may include a constant transconductance bias generator configured to generate a first reference current (e.g., $I_{REF}$) that is dependent on PVT conditions of the first AGC circuit 702, and the second AGC circuit 704 may include another constant transconductance bias generator configured to configured to generate a second reference current. If the transistors in the first and second AGC circuits are fabricated using the same semiconductor process, receive the same power supply rail voltage (Vdd), and are subjected to the same temperature, the second reference current should be equal to the first reference current. In this case, the ratio of m to n may be set such that the comparator 706 is configured to output a logic high signal when the amplitude of the oscillation signal is estimated to be greater than or equal to an amplitude of the reference current multiplied by (1−m/n).

In certain aspects, the adjustable current source may be implemented using the transistor 708. As shown, transistor 708 may have a source coupled to the power supply rail, a drain coupled to the oscillator core circuit 705, and a gate coupled to the gate of the transistor 710 and to the transistor 714. In certain aspects, the transistor 708 may be a p-type transistor. In certain aspects, a transistor size ratio between the transistor 708, the transistor 710, and the transistor 714 is x:1:1, where x≥1.

According to certain aspects, the oscillation circuit 700 may also include a backup oscillator (e.g., as discussed with respect to FIG. 4A and analogous to oscillator 701) configured to generate another oscillation signal, a third AGC circuit (analogous to the first AGC circuit 702), a fourth AGC circuit (analogous to the second AGC circuit 704), and another comparator (analogous to the comparator 706). In certain aspects, the backup oscillator may include another oscillator core circuit for coupling to the resonator, and another adjustable current source coupled to the other oscillator core circuit and configured to control an amplitude of the other oscillation signal. In this case, the third AGC circuit may have an input coupled to an output of the backup oscillator and may have an output coupled to a control input of the other adjustable current source. In some aspects, the process monitor 604 (or the other comparator analogous to comparator 706) may have a third input coupled to the output of the third AGC circuit and may have a fourth input coupled to the output of the fourth AGC circuit. In certain aspects, the fourth AGC circuit may be configured to replicate (e.g., replicate a topology of) the third AGC circuit.

Example Operations for Oscillation Monitoring

Figure 8:
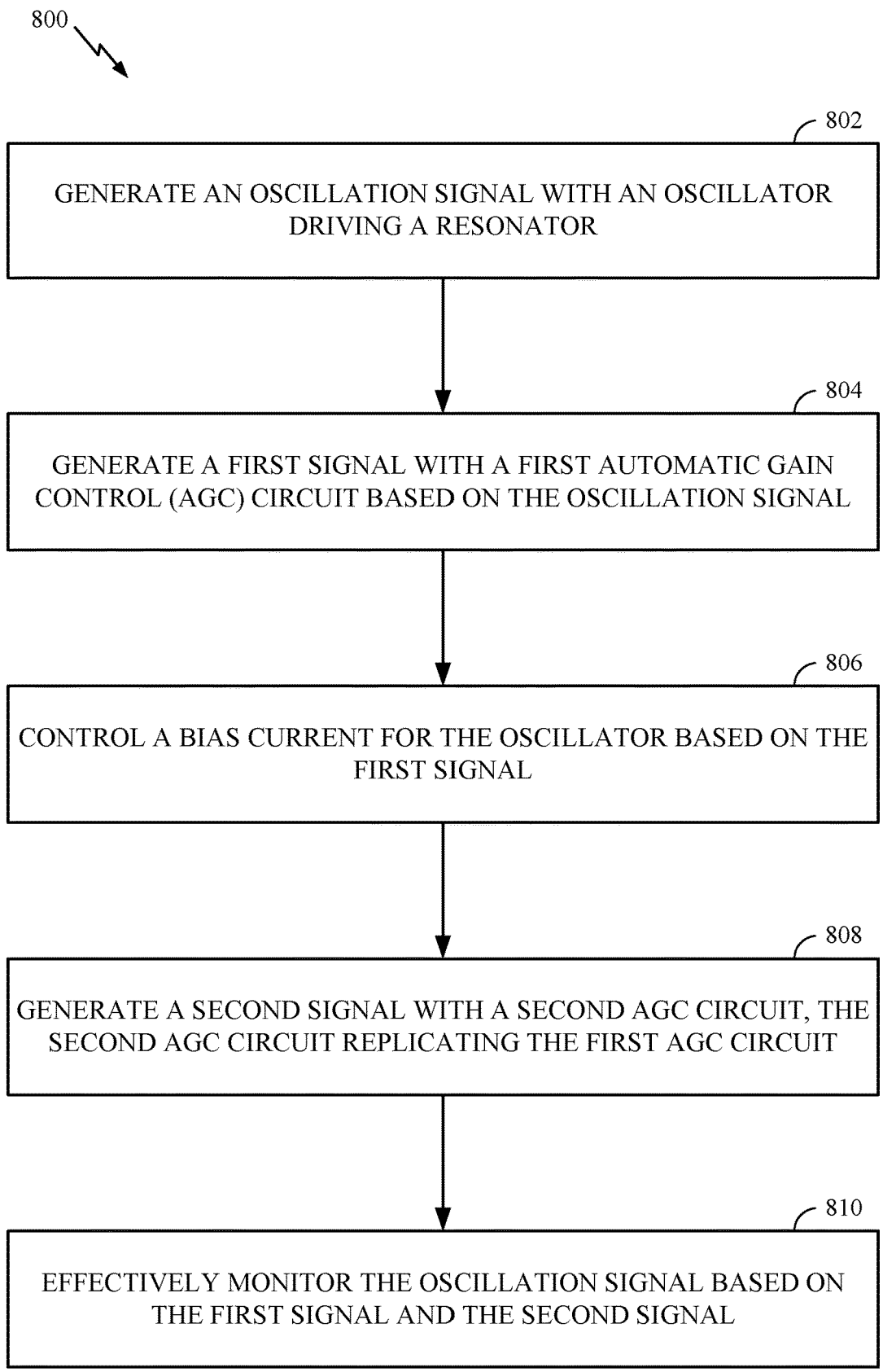
FIG. 8 is a flow diagram illustrating example operations for oscillation monitoring, in accordance with certain aspects of the present disclosure.

FIG. 8 is a flow diagram illustrating example operations 800 for oscillation monitoring, in accordance with certain aspects of the present disclosure. The operations 800 may be performed by an oscillation circuit, such as the oscillation circuit 600 of FIG. 6 or the oscillation circuit 700 of FIG. 7B. The flow diagram includes blocks representing the operations 800.

The operations 800 may begin, at block 802, by generating an oscillation signal (e.g., IN) with an oscillator (e.g., oscillator 701) driving a resonator (e.g., resonator 618, 707). At block 804, a first automatic gain control (AGC) circuit (e.g., the first AGC circuit 702) may generate a first signal (e.g., OUT) based on the oscillation signal. At block 806, the first AGC circuit may control a bias current (e.g., $I_{OUT}$) for the oscillator based on the first signal. At block 808, a second AGC circuit (e.g., the second AGC circuit 704) may generate a second signal (e.g., $OUT_{REF}$). The second AGC circuit may replicate the first AGC circuit. For example, the second AGC circuit may have the same or a similar topology as the first AGC circuit and may be fabricated using the same semiconductor process as the first AGC circuit. At block 810, the oscillation circuit may effectively monitor the oscillation signal (e.g., using logic such as the comparator 706 or the process monitor 604) based on the first signal and the second signal.

According to certain aspects, effectively monitoring the oscillation signal at block 810 may involve effectively monitoring the oscillation signal without directly sensing an amplitude of the oscillation signal.

According to certain aspects, effectively monitoring the oscillation signal at block 810 may involve comparing the first signal and the second signal, and outputting a status signal indicating a failure (e.g., AGC_OK is logic low) when an amplitude of the second signal is lower than an amplitude of the first signal. According to certain aspects, the operations 800 may further involve generating another oscillation signal with a backup oscillator (e.g., oscillator 422 of FIG. 4A) and, in response to the status signal indicating the failure, switching to using the other oscillation signal instead of the oscillation signal.

According to certain aspects, a first transistor size ratio between a first n-type transistor (e.g., the transistor 720) of the comparator and a second n-type transistor (e.g., the transistor 726 or the transistor 728) of the second AGC circuit is m:1, and a second transistor size ratio between a first p-type transistor (e.g., the transistor 718) of the comparator to a second p-type transistor (e.g., the transistor 710 or the transistor 714) of the first AGC circuit is n:1. In certain aspects, the second signal from the second AGC circuit controls the first n-type transistor of the comparator and the second n-type transistor of the second AGC circuit, and the first signal from the first AGC circuit controls the first p-type transistor of the comparator and the second p-type transistor of the first AGC circuit. According to certain aspects, a ratio of m to n is equal to a ratio of a gain of the second AGC circuit (e.g., gain $A_{REF}$) to a gain of the first AGC circuit (e.g., gain A).

According to certain aspects, generating the first signal may involve generating, with a constant transconductance bias generator (e.g., transistors 710, 712, 714, and 716) of the first AGC circuit, a first reference current (e.g., $I_{REF}$ through transistor 710) that is dependent on process, voltage, and temperature (PVT) of the first AGC circuit. In some aspects, generating the second signal may involve generating a second reference current (e.g., $I_{REF}$ through transistor 726), with the second AGC circuit, that is equal to the first reference current.

According to certain aspects, effectively monitoring the oscillation signal at block 810 may involve outputting a logic high signal (e.g., AGC_OK is logic high) from the comparator when an amplitude of the oscillation signal is estimated to be greater than or equal to an amplitude of the first reference current multiplied by (1−m/n).

Example Aspects

In addition to the various aspects described above, specific combinations of aspects are within the scope of the disclosure, some of which are detailed below:

Aspect 1: An oscillation circuit comprising: an oscillator configured to generate an oscillation signal, the oscillator comprising: an oscillator core circuit for coupling to a resonator and configured to generate the oscillation signal to enable the resonator to resonate; and an adjustable current source coupled to the oscillator core circuit and configured to control an amplitude of the oscillation signal; a first automatic gain control (AGC) circuit having an input coupled to an output of the oscillator and having an output coupled to a control input of the adjustable current source; a second AGC circuit configured to replicate the first AGC circuit; and logic having a first input coupled to the output of the first AGC circuit and having a second input coupled to an output of the second AGC circuit.

Aspect 2: The oscillation circuit of Aspect 1, wherein the logic is configured to effectively monitor the oscillation signal based on the output of the first AGC circuit and the output of the second AGC circuit.

Aspect 3: The oscillation circuit of Aspect 1 or 2, wherein the oscillation circuit is configured to effectively monitor the oscillation signal without directly sensing an amplitude of the oscillation signal.

Aspect 4: The oscillation circuit of any of the preceding Aspects, wherein the logic comprises a comparator having a first input coupled to the output of the first AGC circuit and having a second input coupled to the output of the second AGC circuit.

Aspect 5: The oscillation circuit of Aspect 4, wherein the comparator comprises: a first p-type transistor having a source coupled to a power supply rail; a first n-type transistor having a source coupled to a reference potential node for the oscillation circuit and having a drain coupled to a drain of the first p-type transistor, wherein at least one of the first p-type transistor or the first n-type transistor is tunable; and an inverter having an input coupled to the drain of the first p-type transistor and to the drain of the first n-type transistor and having an output coupled to an output of the comparator.

Aspect 6: The oscillation circuit of Aspect 5, wherein the first AGC circuit comprises: a second p-type transistor having a source coupled to the power supply rail; a second n-type transistor having a source coupled to the reference potential node and having a drain coupled to a drain of the second p-type transistor; a third p-type transistor having a source coupled to the power supply rail and having a gate coupled to a drain of the third p-type transistor, to a gate of the second p-type transistor, and to a gate of the first p-type transistor; a third n-type transistor having a drain coupled to the drain and the gate of the third p-type transistor; and a first resistive element coupled between a source of the third n-type transistor and the reference potential node.

Aspect 7: The oscillation circuit of Aspect 6, wherein the first AGC circuit further comprises: a second resistive element coupled between a gate of the second n-type transistor and the drain of the second n-type transistor; a third resistive element coupled between the drain of the second n-type transistor and a gate of the third n-type transistor; and a first capacitive element coupled between the gate of the third n-type transistor and the reference potential node.

Aspect 8: The oscillation circuit of Aspect 7, further comprising a second capacitive element coupled between the gate of the second n-type transistor and the output of the oscillator.

Aspect 9: The oscillation circuit of Aspect 7 or 8, wherein the second n-type transistor, the third n-type transistor, the first resistive element, the second resistive element, and the third resistive element form at least part of a constant transconductance bias generator configured to generate a reference current that is dependent on process, voltage, and temperature (PVT).

Aspect 10: The oscillation circuit of any of Aspects 6-9, wherein a transistor size ratio between the first p-type transistor, the second p-type transistor, and the third p-type transistor is n:1:1, where n≥1.

Aspect 11: The oscillation circuit of any of Aspects 6-10, wherein: the adjustable current source comprises a fourth p-type transistor having a source coupled to the power supply rail, having a drain coupled to the oscillator core circuit, and having a gate coupled to the gate of the second p-type transistor and to the third p-type transistor; and a transistor size ratio between the fourth p-type transistor, the second p-type transistor, and the third p-type transistor is x:1:1, where x≥1.

Aspect 12: The oscillation circuit of any of Aspects 6-10, wherein the second AGC circuit comprises: a fourth p-type transistor having a source coupled to the power supply rail; a fourth n-type transistor having a source coupled to the reference potential node and having a drain coupled to a drain of the fourth p-type transistor, to a gate of the fourth n-type transistor, and to a gate of the first n-type transistor; a fifth p-type transistor having a source coupled to the power supply rail and having a drain coupled to a gate of the fifth p-type transistor and to a gate of the fourth p-type transistor; a fifth n-type transistor having a drain coupled to the drain and the gate of the fifth p-type transistor; and a second resistive element coupled between a source of the fifth n-type transistor and the reference potential node.

Aspect 13: The oscillation circuit of Aspect 12, wherein a transistor size ratio between the first n-type transistor, the fourth n-type transistor, and the fifth n-type transistor is m:1:1, where m≥1.

Aspect 14: The oscillation circuit of Aspect 13, wherein a transistor size ratio between the first p-type transistor, the second p-type transistor, and the third p-type transistor is n:1:1, where n≥1.

Aspect 15: The oscillation circuit of Aspect 14, wherein a ratio of m/n is equal to a ratio of a gain of the second AGC circuit to a gain of the first AGC circuit.

Aspect 16: The oscillation circuit of Aspect 15, wherein: the first AGC circuit comprises a constant transconductance bias generator configured to generate a reference current; and the ratio of m/n is set such that the comparator is configured to output a logic high signal when the amplitude of the oscillation signal is estimated to be greater than or equal to an amplitude of the reference current multiplied by (1−m/n).

Aspect 17: The oscillation circuit of any of Aspects 4-16, wherein the comparator is configured to output a logic high signal when an amplitude of a signal at the output of the second AGC circuit is greater than or equal to an amplitude of a signal at the output of the first AGC circuit.

Aspect 18: The oscillation circuit of any of the preceding Aspects, wherein the first AGC circuit comprises a constant transconductance bias generator configured to generate a first reference current that is dependent on process, voltage, and temperature (PVT) of the first AGC circuit.

Aspect 19: The oscillation circuit of Aspect 18, wherein the second AGC circuit is configured to generate a second reference current that is equal to the first reference current.

Aspect 20: The oscillation circuit of any of the preceding Aspects, wherein an input of the second AGC circuit is open-circuited, such that the input of the second AGC circuit is configured to have zero current.

Aspect 21: The oscillation circuit of any of the preceding Aspects, further comprising: a backup oscillator configured to generate another oscillation signal, the backup oscillator comprising: another oscillator core circuit for coupling to the resonator; and another adjustable current source coupled to the other oscillator core circuit and configured to control an amplitude of the other oscillation signal; and a third AGC circuit having an input coupled to an output of the backup oscillator and having an output coupled to a control input of the other adjustable current source, wherein the logic has a third input coupled to the output of the third AGC circuit.

Aspect 22: The oscillation circuit of Aspect 21, further comprising a fourth AGC circuit configured to replicate a topology of the third AGC circuit, wherein the logic has a fourth input coupled to an output of the fourth AGC circuit.

Aspect 23: A method of oscillation monitoring, comprising: generating an oscillation signal with an oscillator driving a resonator; generating a first signal with a first automatic gain control (AGC) circuit based on the oscillation signal; controlling a bias current for the oscillator based on the first signal; generating a second signal with a second AGC circuit, the second AGC circuit replicating the first AGC circuit; and effectively monitoring the oscillation signal based on the first signal and the second signal.

Aspect 24: The method of Aspect 23, wherein the effectively monitoring comprises effectively monitoring the oscillation signal without directly sensing an amplitude of the oscillation signal.

Aspect 25: The method of Aspect 23 or 24, wherein the effectively monitoring comprises comparing the first signal and the second signal and outputting a status signal indicating a failure when an amplitude of the second signal is lower than an amplitude of the first signal.

Aspect 26: The method of Aspect 25, further comprising generating another oscillation signal with a backup oscillator, and in response to the status signal indicating the failure, switching to using the other oscillation signal instead of the oscillation signal.

Aspect 27: The method of any of Aspects 23-26, wherein: a first transistor size ratio between a first n-type transistor of a comparator and a second n-type transistor of the second AGC circuit is m:1; a second transistor size ratio between a first p-type transistor of the comparator to a second p-type transistor of the first AGC circuit is n:1; the second signal from the second AGC circuit controls the first n-type transistor of the comparator and the second n-type transistor of the second AGC circuit; the first signal from the first AGC circuit controls the first p-type transistor of the comparator and the second p-type transistor of the first AGC circuit; and a ratio of m/n is equal to a ratio of a gain of the second AGC circuit to a gain of the first AGC circuit.

Aspect 28: The method of any of Aspects 23-27, wherein generating the first signal comprises generating, with a constant transconductance bias generator of the first AGC circuit, a first reference current that is dependent on process, voltage, and temperature (PVT) of the first AGC circuit.

Aspect 29: The method of Aspect 28, wherein generating the second signal comprises generating a second reference current, with the second AGC circuit, that is equal to the first reference current.

Aspect 30: The method of Aspect 28 or 29, wherein the effectively monitoring comprises outputting a logic high signal from a comparator when an amplitude of the oscillation signal is estimated to be greater than or equal to an amplitude of the first reference current multiplied by (1−m/n).

Aspect 31: An apparatus with oscillation monitoring, comprising: means for generating an oscillation signal; means for generating a first automatic gain control (AGC) signal based on the oscillation signal; means for controlling a bias current for the means for generating the oscillation signal, based on the first AGC signal; means for generating a second AGC signal, the means for generating the second AGC signal replicating the means for generating the first AGC signal; and means for effectively monitoring the oscillation signal based on the first AGC signal and the second AGC signal.

Additional Considerations

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

For example, means for generating an oscillation signal may include an oscillator (e.g., oscillator 420 or 422 depicted in FIG. 4A or oscillator 701 shown in FIG. 7B) driving a resonator (e.g., resonator 418 depicted in FIG. 4A, resonator 618 portrayed in FIG. 6, or resonator 707 shown in FIG. 7B). Means for generating a first AGC signal may include a main AGC circuit (e.g., the first AGC circuit 702 depicted in FIGS. 7A and 7B). Means for controlling a bias current for the means for generating the first signal may include an adjustable current source (e.g., the current source 406 or 412 shown in FIG. 4A, the current source 610 portrayed in FIG. 6, the transistor 708 illustrated in FIG. 7B). Means for generating the second AGC signal may include a replica AGC circuit (e.g., the second AGC circuit 704 depicted in FIGS. 7A and 7B). Means for effectively monitoring may include logic, such as a processor or process monitor (e.g., the safety monitor 416 depicted in FIG. 4A, the process monitor 604 and/or the oscillator health monitor 602 illustrated in FIG. 6, or the comparator 706 shown in FIGS. 7A and 7B).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. An oscillation circuit comprising:
an oscillator configured to generate an oscillation signal, the oscillator comprising:
an oscillator core circuit for coupling to a resonator and configured to generate the oscillation signal to enable the resonator to resonate; and
an adjustable current source coupled to the oscillator core circuit and configured to control an amplitude of the oscillation signal;
a first automatic gain control (AGC) circuit having an input coupled to an output of the oscillator and having an output coupled to a control input of the adjustable current source;
a second AGC circuit configured to replicate the first AGC circuit such that the first AGC circuit is configured to generate a first reference signal and the second AGC circuit is configured to generate a second reference signal that replicates the first reference signal; and
logic having a first input coupled to the output of the first AGC circuit and having a second input coupled to an output of the second AGC circuit.

2. The oscillation circuit of claim 1, wherein the logic is configured to effectively monitor the oscillation signal based on the output of the first AGC circuit and the output of the second AGC circuit.

3. The oscillation circuit of claim 1, wherein the oscillation circuit is configured to effectively monitor the oscillation signal without directly sensing an amplitude of the oscillation signal.

4. The oscillation circuit of claim 1, wherein the logic comprises a comparator having a first input coupled to the output of the first AGC circuit and having a second input coupled to the output of the second AGC circuit.

5. The oscillation circuit of claim 4, wherein the comparator comprises:
a first p-type transistor having a source coupled to a power supply rail;
a first n-type transistor having a source coupled to a reference potential node for the oscillation circuit and having a drain coupled to a drain of the first p-type transistor, wherein at least one of the first p-type transistor or the first n-type transistor is tunable; and
an inverter having an input coupled to the drain of the first p-type transistor and to the drain of the first n-type transistor and having an output coupled to an output of the comparator.

6. The oscillation circuit of claim 5, wherein the first AGC circuit comprises:
a second p-type transistor having a source coupled to the power supply rail;
a second n-type transistor having a source coupled to the reference potential node and having a drain coupled to a drain of the second p-type transistor;
a third p-type transistor having a source coupled to the power supply rail and having a gate coupled to a drain of the third p-type transistor, to a gate of the second p-type transistor, and to a gate of the first p-type transistor;
a third n-type transistor having a drain coupled to the drain and the gate of the third p-type transistor; and
a first resistive element coupled between a source of the third n-type transistor and the reference potential node.

7. The oscillation circuit of claim 6, wherein the first AGC circuit further comprises:
a second resistive element coupled between a gate of the second n-type transistor and the drain of the second n-type transistor;
a third resistive element coupled between the drain of the second n-type transistor and a gate of the third n-type transistor; and
a first capacitive element coupled between the gate of the third n-type transistor and the reference potential node.

8. The oscillation circuit of claim 7, further comprising a second capacitive element coupled between the gate of the second n-type transistor and the output of the oscillator.

9. The oscillation circuit of claim 7, wherein the second n-type transistor, the third n-type transistor, the first resistive element, the second resistive element, and the third resistive element form at least part of a constant transconductance bias generator configured to generate a reference current that is dependent on process, voltage, and temperature (PVT).

10. The oscillation circuit of claim 6, wherein a transistor size ratio between the first p-type transistor, the second p-type transistor, and the third p-type transistor is n:1:1, where n≥1.

11. The oscillation circuit of claim 6, wherein:
the adjustable current source comprises a fourth p-type transistor having a source coupled to the power supply rail, having a drain coupled to the oscillator core circuit, and having a gate coupled to the gate of the second p-type transistor and to the third p-type transistor; and
a transistor size ratio between the fourth p-type transistor, the second p-type transistor, and the third p-type transistor is x:1:1, where x≥1.

12. The oscillation circuit of claim 6, wherein the second AGC circuit comprises:
a fourth p-type transistor having a source coupled to the power supply rail;
a fourth n-type transistor having a source coupled to the reference potential node and having a drain coupled to a drain of the fourth p-type transistor, to a gate of the fourth n-type transistor, and to a gate of the first n-type transistor;
a fifth p-type transistor having a source coupled to the power supply rail and having a drain coupled to a gate of the fifth p-type transistor and to a gate of the fourth p-type transistor;
a fifth n-type transistor having a drain coupled to the drain and the gate of the fifth p-type transistor; and
a second resistive element coupled between a source of the fifth n-type transistor and the reference potential node.

13. The oscillation circuit of claim 12, wherein a transistor size ratio between the first n-type transistor, the fourth n-type transistor, and the fifth n-type transistor is m:1:1, where m≥1.

14. The oscillation circuit of claim 13, wherein a transistor size ratio between the first p-type transistor, the second p-type transistor, and the third p-type transistor is n:1:1, where n≥1.

15. The oscillation circuit of claim 14, wherein a ratio of m/n is equal to a ratio of a gain of the second AGC circuit to a gain of the first AGC circuit.

16. The oscillation circuit of claim 15, wherein:
the first AGC circuit comprises a constant transconductance bias generator configured to generate a reference current; and
the ratio of m/n is set such that the comparator is configured to output a logic high signal when the amplitude of the oscillation signal is estimated to be greater than or equal to an amplitude of the reference current multiplied by (1−m/n).

17. The oscillation circuit of claim 4, wherein the comparator is configured to output a logic high signal when an amplitude of a signal at the output of the second AGC circuit is greater than or equal to an amplitude of a signal at the output of the first AGC circuit.

18. The oscillation circuit of claim 1, wherein the first AGC circuit comprises a constant transconductance bias generator configured to generate a first reference current that is dependent on process, voltage, and temperature (PVT) of the first AGC circuit.

19. The oscillation circuit of claim 18, wherein the second AGC circuit is configured to generate a second reference current that is equal to the first reference current.

20. The oscillation circuit of claim 1, wherein an input of the second AGC circuit is open-circuited, such that the input of the second AGC circuit is configured to have zero current.

21. The oscillation circuit of claim 1, further comprising:
a backup oscillator configured to generate another oscillation signal, the backup oscillator comprising:
another oscillator core circuit for coupling to the resonator; and
another adjustable current source coupled to the other oscillator core circuit and configured to control an amplitude of the other oscillation signal; and
a third AGC circuit having an input coupled to an output of the backup oscillator and having an output coupled to a control input of the other adjustable current source, wherein the logic has a third input coupled to the output of the third AGC circuit.

22. The oscillation circuit of claim 21, further comprising a fourth AGC circuit configured to replicate a topology of the third AGC circuit, wherein the logic has a fourth input coupled to an output of the fourth AGC circuit.

23. A method of oscillation monitoring, comprising:
generating an oscillation signal with an oscillator driving a resonator;
generating a first signal with a first automatic gain control (AGC) circuit based on the oscillation signal;
controlling a bias current for the oscillator based on the first signal;
generating a second signal with a second AGC circuit, the second AGC circuit replicating the first AGC circuit; and
effectively monitoring the oscillation signal based on the first signal and the second signal, wherein the effectively monitoring comprises indicating a failure when an amplitude of the second signal is lower than an amplitude of the first signal.

24. The method of claim 23, wherein the effectively monitoring comprises effectively monitoring the oscillation signal without directly sensing an amplitude of the oscillation signal.

25. The method of claim 23, wherein the effectively monitoring further comprises comparing the first signal and the second signal, wherein the failure is indicated based on the comparison.

26. The method of claim 25, further comprising:
generating another oscillation signal with a backup oscillator; and
in response to indicating the failure, switching to using the other oscillation signal instead of the oscillation signal.

27. The method of claim 23, wherein:
a first transistor size ratio between a first n-type transistor of a comparator and a second n-type transistor of the second AGC circuit is m:1;
a second transistor size ratio between a first p-type transistor of the comparator to a second p-type transistor of the first AGC circuit is n:1;
the second signal from the second AGC circuit controls the first n-type transistor of the comparator and the second n-type transistor of the second AGC circuit;
the first signal from the first AGC circuit controls the first p-type transistor of the comparator and the second p-type transistor of the first AGC circuit; and
a ratio of m/n is equal to a ratio of a gain of the second AGC circuit to a gain of the first AGC circuit.

28. The method of claim 27, wherein generating the first signal comprises generating, with a constant transconductance bias generator of the first AGC circuit, a first reference current that is dependent on process, voltage, and temperature (PVT) of the first AGC circuit.

29. The method of claim 28, wherein generating the second signal comprises generating a second reference current, with the second AGC circuit, that is equal to the first reference current.

30. The method of claim 28, wherein the effectively monitoring comprises outputting a logic high signal from the comparator when an amplitude of the oscillation signal is estimated to be greater than or equal to an amplitude of the first reference current multiplied by (1−m/n).

31. An apparatus with oscillation monitoring, comprising:
means for generating an oscillation signal;
means for generating a first automatic gain control (AGC) signal based on the oscillation signal;
means for controlling a bias current for the means for generating the oscillation signal, based on the first AGC signal;
means for generating a second AGC signal, the means for generating the second AGC signal replicating the means for generating the first AGC signal; and
means for effectively monitoring the oscillation signal based on the first AGC signal and the second AGC signal, wherein the means for effectively monitoring includes means for indicating a failure when an amplitude of the second AGC signal is lower than an amplitude of the first AGC signal.

* * * * *